United States Patent
Choi et al.

(10) Patent No.: US 10,879,528 B2
(45) Date of Patent: Dec. 29, 2020

(54) NEGATIVE ELECTRODE ACTIVE MATERIAL, METHOD OF PREPARING THE SAME, AND LITHIUM SECONDARY BATTERY INCLUDING THE SAME

(71) Applicant: LG Chem, Ltd., Seoul (KR)

(72) Inventors: Jung Hyun Choi, Daejeon (KR); Yong Ju Lee, Daejeon (KR); Eun Kyung Kim, Daejeon (KR)

(73) Assignee: LG Chem, Ltd.

( * ) Notice: Subject to any disclaimer, the term of this patent is extended or adjusted under 35 U.S.C. 154(b) by 381 days.

(21) Appl. No.: 15/749,936

(22) PCT Filed: Mar. 6, 2017

(86) PCT No.: PCT/KR2017/002396
§ 371 (c)(1),
(2) Date: Feb. 2, 2018

(87) PCT Pub. No.: WO2017/164538
PCT Pub. Date: Sep. 28, 2017

(65) Prior Publication Data
US 2018/0226640 A1    Aug. 9, 2018

(30) Foreign Application Priority Data

Mar. 24, 2016 (KR) .......... 10-2016-0035028
Mar. 24, 2016 (KR) .......... 10-2016-0035029
Feb. 28, 2017 (KR) .......... 10-2017-0026129

(51) Int. Cl.
*H01M 4/36* (2006.01)
*H01M 4/38* (2006.01)
(Continued)

(52) U.S. Cl.
CPC ............. *H01M 4/366* (2013.01); *B01J 13/04* (2013.01); *C23C 14/185* (2013.01);
(Continued)

(58) Field of Classification Search
CPC ..................................... H01M 4/366
See application file for complete search history.

(56) References Cited

U.S. PATENT DOCUMENTS

2005/0221188 A1* 10/2005 Takami ............. H01M 10/0566
                                                     429/231.95
2006/0134516 A1    6/2006 Im et al.
(Continued)

FOREIGN PATENT DOCUMENTS

CN    102110853 A    6/2011
CN    103299459 A    9/2013
(Continued)

OTHER PUBLICATIONS

Terms and Data (Year: 2020).*
(Continued)

*Primary Examiner* — Brian R Ohara
(74) *Attorney, Agent, or Firm* — Lerner, David, Littenberg, Krumholz & Mentlik, LLP

(57) ABSTRACT

The present invention relates to a negative electrode active material, a method of preparing the same, and a lithium secondary battery including the same. In particular, the present invention relates to a composite negative electrode active material that includes: a core capable of intercalating and deintercalating lithium ions; and a plurality of coating layers comprising two or more Si layers having different densities formed on a surface of the core, and thus has enhanced stability by minimizing the formation of cracks occurring by the repetition of charging and discharging, a method of preparing the same, and a lithium secondary battery including the same and thus exhibiting enhanced lifespan characteristics.

18 Claims, 1 Drawing Sheet

(51) Int. Cl.
  *H01M 4/13* (2010.01)
  *H01M 4/587* (2010.01)
  *H01M 4/62* (2006.01)
  *H01M 10/0525* (2010.01)
  *H01M 4/02* (2006.01)
  *B01J 13/04* (2006.01)
  *C23C 14/18* (2006.01)
  *C23C 14/20* (2006.01)
  *C23C 14/34* (2006.01)

(52) U.S. Cl.
  CPC ............ *C23C 14/205* (2013.01); *C23C 14/34* (2013.01); *H01M 4/13* (2013.01); *H01M 4/386* (2013.01); *H01M 4/587* (2013.01); *H01M 4/625* (2013.01); *H01M 10/0525* (2013.01); *H01M 2004/027* (2013.01)

(56) References Cited

U.S. PATENT DOCUMENTS

| | | |
|---|---|---|
| 2006/0134518 A1 | 6/2006 | Kogetsu et al. |
| 2009/0061319 A1 | 3/2009 | Kim et al. |
| 2011/0159368 A1 | 6/2011 | Hirose et al. |
| 2013/0288106 A1 | 10/2013 | Chang et al. |
| 2015/0243969 A1* | 8/2015 | Ku .................. H01M 4/134 429/231.5 |
| 2016/0020453 A1 | 1/2016 | Liu et al. |
| 2017/0040610 A1 | 2/2017 | Otsuka et al. |
| 2017/0047580 A1 | 2/2017 | Cho et al. |
| 2018/0034056 A1* | 2/2018 | Cho .................. H01M 4/38 |

FOREIGN PATENT DOCUMENTS

| | | |
|---|---|---|
| CN | 105006549 A | 10/2015 |
| JP | 2003303586 A | 10/2003 |
| JP | 2013246989 A | 12/2013 |
| JP | 2016026381 A | 2/2016 |
| JP | 2018512702 A | 5/2018 |
| KR | 20060069738 A | 6/2006 |
| KR | 100814591 B1 | 3/2008 |
| KR | 100878718 B1 | 1/2009 |
| KR | 20150101310 A | 9/2015 |
| KR | 20160031782 A | 3/2016 |
| WO | 2015159935 A1 | 10/2015 |
| WO | 2015163695 A1 | 10/2015 |
| WO | 2016137024 A1 | 9/2016 |

OTHER PUBLICATIONS

Search report from International Application No. PCT/KR2017/002396, dated Jun. 1, 2017.
Chinese Search Report for Application No. 201780002939.3, dated Jun. 9, 2020, pp. 1-3.

* cited by examiner

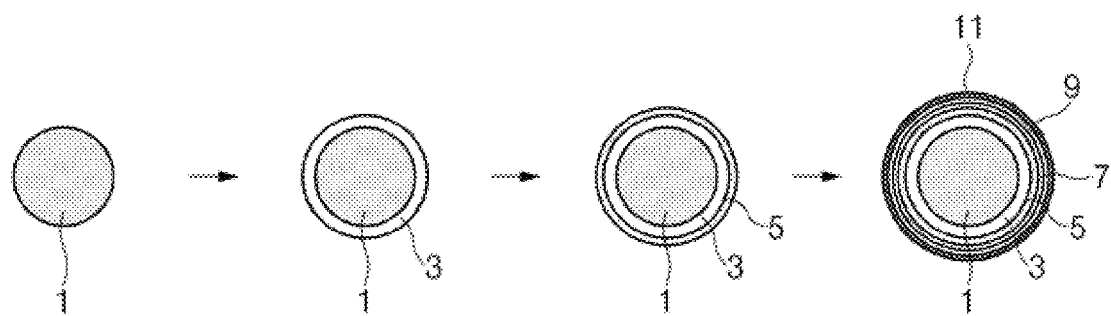

NEGATIVE ELECTRODE ACTIVE MATERIAL, METHOD OF PREPARING THE SAME, AND LITHIUM SECONDARY BATTERY INCLUDING THE SAME

CROSS-REFERENCE TO RELATED APPLICATIONS

The present application is a national phase entry under 35 U.S.C. § 371 of International Application No. PCT/KR2017/002396, filed on Mar. 6, 2017, which claims priority from Korean Patent Application Nos. 10-2016-0035028, filed on Mar. 24, 2016, 10-2016-0035029, filed on Mar. 24, 2016, and 10-2017-0026129, filed on Feb. 28, 2017, the disclosures of which are incorporated herein by reference in their entirety.

TECHNICAL FIELD

The present invention relates to a negative electrode active material, a method of preparing the same, and a lithium secondary battery including the same, and more particularly, to a composite negative electrode active material including a plurality of silicon coating layers with different densities and thus exhibiting enhanced stability, a method of preparing the same, and a lithium secondary battery including the same and thus exhibiting enhanced lifespan characteristics.

BACKGROUND ART

In line with the development of the information and communication industry in recent years, electronic devices have become smaller, lighter, thinner, and portable, and, accordingly, demand for batteries having high capacity and a long lifespan and used as power sources of such electronic devices is increasing. Lithium batteries, in particular, lithium ion batteries (LIBs), have high energy density and are easily designed, and thus have been adopted as power sources of a variety of portable devices.

Recently, lithium-ion batteries have been used as power sources for electric vehicles or electric power storage, in addition to applications such as portable IT devices, and the like, and thus research into positive electrode active materials and negative electrode active materials that have high capacity and exhibit enhanced cycle lifespan characteristics, as materials for lithium-ion batteries, have been expanded.

That is, as an example of the negative electrode active materials, high-capacity non-carbon-based negative electrode active materials having much higher capacity per unit weight than that of conventionally used carbon have been actively studied.

Among these non-carbon-based active materials, a silicon (Si)-based composite active material, e.g., an Si/C active material, has a structure in which a Si layer is formed on a surface of a carbon-based negative electrode active material, and is known to have much higher capacity than the theoretical capacity (about 372 mAh/g) of carbon-based negative electrode active materials and excellent discharge efficiency (80%), and thus has received much attention as a material for high-capacity secondary batteries.

However, Si-based active materials have a high-volume expansion rate, and thus deformation such as cracks or the like occurs in the active material during cycles of charging and discharging, resulting in deterioration of cycle lifespan characteristics of batteries.

Therefore, there is an urgent need to develop a negative electrode active material capable of addressing these problems and a secondary battery including the same and thus exhibiting enhanced capacity characteristics.

DISCLOSURE

Technical Problem

The present invention has been made in view of the above problems, and it is one object of the present invention to provide a composite negative electrode active material with high physical stability.

It is another object of the present invention to provide a method of preparing the above-described composite negative electrode active material.

It is still another object of the present invention to provide a negative electrode for a high-capacity lithium secondary battery which includes the composite negative electrode active material and thus exhibits enhanced cycle characteristics, and a lithium secondary battery including the negative electrode.

Technical Solution

According to an embodiment of the present invention, a composite negative electrode active material includes: a core capable of intercalating and deintercalating lithium ions; and a plurality of coating layers comprising two or more silicon (Si) layers having different densities formed on a surface of the core.

In this case, the core may be a carbon-based core or a non-carbon-based core. In particular, the carbon-based core may include one selected from the group consisting of natural graphite, artificial graphite, graphitizable carbon, non-graphitizable carbon, carbon black, and graphite oxides, or a mixture of two or more of these materials. The non-carbon-based core may include Si or a non-crystalline or crystalline Si oxide represented by $SiO_x$ where $0<x\leq2$. The plurality of coating layers may include a high-density Si layer and a low-density Si layer.

In addition, the plurality of coating layers may have a structure in which two or more of a high-density Si layer and a low-density Si layer are alternately and repeatedly formed in a direction from the core to the surface of the negative electrode active material.

In addition, the high-density Si layer and the low-density Si layer may have the same crystallinity or different crystallinities.

The high-density Si layer may have a bulk density of greater than 2.0 g/cm$^3$ to 2.33 g/cm$^3$ or less, and the low-density Si layer may have a bulk density of 2.0 g/cm$^3$ or less.

The composite negative electrode active material may further include a carbon coating layer on a surface of the plurality of coating layers.

According to an embodiment of the present invention, a method of preparing a negative electrode active material for a secondary battery includes: forming a high-density Si layer on a surface of a core capable of intercalating and deintercalating lithium ions; forming a low-density Si layer on the surface of the core with the high-density Si layer formed thereon; and repeating the forming of the high-density Si layer and the forming of the low-density Si layer a plurality of times.

The high-density Si layer may be formed by radio-frequency (RF) sputtering. In this case, the forming of the high-density Si layer may be performed under a low gas pressure.

The low-density Si layer may be formed by RF sputtering. In this case, the forming of the low-density Si layer may be performed under a high gas pressure.

The method may further include forming a carbon coating layer.

According to an embodiment of the present invention, a negative electrode and a lithium secondary battery includes: a current collector; and an electrode mixture layer including the composite negative electrode active material of the present invention formed on at least one surface of the current collector.

Advantageous Effects

A composite negative electrode active material according to the present invention includes: a core capable of intercalating and deintercalating lithium ions; and a plurality of coating layers comprising two or more silicon (Si) layers having different densities on a surface of the core, and thus cracks can be prevented from being formed in the negative electrode active material due to repetition of charging and discharging. In addition, even when cracks occur in the surface of the negative electrode active material, a lithium secondary battery with enhanced lifespan characteristics and capacity characteristics can be manufactured.

DESCRIPTION OF DRAWINGS

The following drawings appended to the present specification are intended to illustrate exemplary embodiments of the present invention, and the spirit of the present invention will be more clearly understood from the accompanying drawings together with the foregoing description of the invention, and thus illustrations in the drawings should not be construed as limiting the scope of the present invention.

FIG. 1 is a schematic view of a composite negative electrode active material according to an embodiment of the present invention.

BEST MODE

Hereinafter, the present invention will be described in more detail.

The terms or words used in the present specification and claims should not be construed as being limited to ordinary or dictionary meanings and should be construed as meanings and concepts consistent with the spirit of the present invention based on a principle that an inventor can appropriately define concepts of terms to explain the invention of the inventor in the best way.

Conventional silicon (Si)-based active materials have a high volume expansion rate, and thus cracks occur even in an interface of the active material during cycles of charging and discharging. As a result, a core exposed via the cracks undergoes a side reaction with an electrolyte, resulting in deterioration of cycle lifespan characteristics, and thus it is difficult to manufacture a secondary battery with long lifespan and high capacity. Therefore, to address these problems, the present invention provides a composite negative electrode active material including a plurality of Si coating layers formed on a surface of a core and thus exhibiting increased physical stability, a method of preparing the same, and a secondary battery including the same.

Negative Electrode Active Material

In particular, an embodiment of the present invention provides a composite negative electrode active material including: a core capable of intercalating and deintercalating lithium ions; and a plurality of coating layers comprising two or more silicon (Si) layers having different densities on a surface of the core.

First, in the composite negative electrode active material of the present invention, the core may include a carbon-based core or a non-carbon-based core.

In the non-carbon-based core capable of intercalating and deintercalating lithium ions, the term "non-carbon-based" as used herein refers to a carbon-free material. According to an embodiment of the present invention, the non-carbon-based core may include at least one of Si and non-crystalline or crystalline silicon oxides represented by $SiO_x$ where $0<x\leq2$.

When the non-carbon-based core consists of $SiO_x$, the amount of Si may range from about 50 wt % to about 70 wt % based on the total weight of the core. When the amount of crystalline Si is within the above range, high capacity and excellent lifespan characteristics may be efficiently achieved. In particular, in the silicon oxide of $SiO_x$, $0.5<x<1.5$. More particularly, particles of the silicon oxide of $SiO_x$ may satisfy the condition: about $0.6\leq x\leq$about 0.95.

In the carbon-based core capable of intercalating and deintercalating lithium ions, the term "carbon-based" as used herein means the inclusion of at least about 50 wt % of carbon. For example, the carbon-based core may include at least about 60 wt %, at least about 70 wt %, at least about 80 wt %, and, particularly, at least about 90 wt %, or may consist of 100 wt % of a carbon material.

According to an embodiment of the present invention, the carbon-based core may include one selected from the group consisting of natural graphite, artificial graphite, graphitizable carbon (soft carbon), non-graphitizable carbon (hard carbon), carbon black, and graphite oxides, or a mixture of two or more of these materials. More preferably, the carbon-based core may consist of natural graphite.

The average particle diameter of such core is not particularly limited. However, when the average particle diameter of the core is too small, the core may have high reactivity with an electrolyte, and thus cycle characteristics may deteriorate. On the other hand, when the average particle diameter of the core is too large, dispersion stability of the core may be reduced when forming a negative electrode slurry and a surface of a negative electrode may become rough. Thus, the average particle diameter of the core may range from 0.5 μm to 30 μm.

For example, when the core is a non-carbon-based core, the non-carbon-based core has an average particle diameter of, preferably, 0.5 μm to 10 μm, and, more preferably, 1 μm to 5 μm.

For example, when the core is a carbon-based core, the carbon-based core has an average particle diameter of, preferably, 5 μm to 30 μm, and, more preferably, 10 μm to 20 μm.

In addition, the core may have a spherical shape in which at least a portion thereof has a curved or bent appearance, or a polygonal shape such as an approximately spherical shape, an oval shape, or the like which is not a completely spherical shape, and the core may have irregularities at a surface thereof.

In the negative electrode active material of the present invention, a ratio of the average particle diameter of the core to a total thickness of the plurality of coating layers may be 1:0.1 to 0.7. For example, when the core is a non-carbon-based core, a ratio of the average particle diameter of the non-carbon-based core to the total thickness of the plurality of coating layers may be 1:0.3 to 0.7, in particular, 1:0.5. For example, when the core is a carbon-based core, a ratio of the average particle diameter of the carbon-based core to the total thickness of the plurality of coating layers may be 1:0.1 to 0.5, in particular, 1:0.1. In this case, when the total thickness proportion of the plurality of coating layers is less than 0.1, an effect of preventing cracks from occurring in the active material layer is insignificant. In addition, when the total thickness proportion of the plurality of coating layers is greater than 0.7, a non-uniform Si layer may be formed.

That is, when the total thickness proportion of the plurality of coating layers is within the above range, in the negative electrode active material including these coating layers, a great volumetric change of the core is alleviated during charging and discharging, and thus high capacity may be maintained. It is most preferably that the thickness of the coating layers is uniformly maintained over an entire surface area of the core, but desired effects of the present invention may be achieved even in a case in which a deviation of the thickness exists or the coating layers are formed only partially on the surface of the core.

In particular, in the negative electrode active material of the present invention, the plurality of coating layers consisting of two or more Si layers having different densities may include a high-density Si layer and a low-density Si layer.

In this regard, the Si layers may include at least about 50 wt % of Si, for example, at least about 70 wt % of Si, and, in particular, at least about 90 wt % of Si, or may consist of 100 wt % of Si. In particular, the Si layer may include a Si single phase such as Si and may also include, a material selected from $SiO_x$ where $0<x\leq 2$, alloys such as Si—Z, and the like (wherein Z is an alkali metal, an alkaline earth metal, a Group 13 element, a Group 14 element, a transition metal, a rare earth element, or a combination thereof, except for Si), and combinations thereof. The element Z may be selected from the group consisting of magnesium (Mg), calcium (Ca), strontium (Sr), barium (Ba), radium (Ra), scandium (Sc), yttrium (Y), lanthanum (La), titanium (Ti), zirconium (Zr), hafnium (Hf), vanadium (V), niobium (Nb), tantalum (Ta), chromium (Cr), molybdenum (Mo), tungsten (W), technetium (Tc), rhenium (Re), iron (Fe), ruthenium (Ru), osmium (Os), cobalt (Co), rhodium (Rh), iridium (Ir), nickel (Ni), lead (Pd), platinum (Pt), copper (Cu), silver (Ag), gold (Au), zinc (Zn), cadmium (Cd), boron (B), germanium (Ge), phosphorus (P), arsenic (As), antimony (Sb), bismuth (Bi), sulfur (S), selenium (Se), tellurium (Te), polonium (Po), and combinations thereof.

The high-density Si layer and the low-density Si layer may take an amorphous form, a crystalline form such as a monocrystalline or polycrystalline form, or a mixed form thereof, and may have the same crystallinity or different crystallinities.

In particular, the high-density Si layer and the low-density Si layer may be mainly amorphous, but may partially include crystallinity according to a calcination temperature after subsequent carbon coating formation.

In addition, in the negative electrode active material of the present invention, the phrase "a plurality of coating layers" as used herein refers to a structure in which two or more of a high-density Si layer and a low-density Si layer are alternately and repeatedly formed in a direction from the core to the surface of the negative electrode active material. That is, the negative electrode active material of the present invention may include two Si coating layers consisting of a first high-density Si layer and a first low-density Si layer on the surface of the core, or may include, on the surface of the core, a plurality of high-density Si layers and a plurality of low-density Si layers, e.g., four or more Si coating layers in which a second high-density Si layer and a second low-density Si layer are alternately and repeatedly formed on two Si layers in which a first high-density Si layer and a first low-density Si layer are sequentially formed. In this case, in the plurality of coating layers, a formation order of the high-density Si layer and the low-density Si layer is not particularly limited, and the high-density Si layer may be disposed on the low-density Si layer.

In addition, in the negative electrode active material of the present invention, the terms "high-density" and "low-density" as here herein refers to bulk density measured based on the volume of Si layers included in the negative electrode active material, and may be defined by Equation 1 below. The bulk density of each high-density Si layer may range from greater than 2.0 g/cm³ to 2.33 g/cm³ or less, and the bulk density of each low-density Si layer may be 2.0 g/cm³ or less.

$$\text{Bulk density} = \text{weight of Si layer (kg)/volume of Si layer (m}^3\text{)} \qquad \text{<Equation 1>}$$

When the bulk density of the high-density Si layer is 2.0 g/cm³ or less, or greater than 2.33 g/cm³, the core may not be uniformly coated, and thus it is difficult to achieve desired effects. In addition, when the bulk density of the low-density Si layer is greater than 2.0 g/cm³, an effect of preventing cracks from occurring in the active material layer according to the volume expansion rate is insignificant.

In addition, in the negative electrode active material of the present invention, when the plurality of coating layers consist of two layers including a high-density Si layer and a low-density Si layer, a ratio of the thickness of the high-density Si layer to the thickness of the low-density Si layer may be 1:1. In particular, when four or more of high-density Si layers and low-density Si layers are alternately and repeatedly formed, a thickness ratio of the first high-density Si layer to the first low-density Si layer to the second high-density Si layer to the second low-density Si layer may be 1:1:1:1.

The negative electrode active material of the present invention having the above-described structure may have an average particle diameter (D50) of 3 μm to 55 μm. In particular, when the core is a non-carbon-based core, the average particle diameter (D50) of the negative electrode active material may range from 3 μm to 15 μm, preferably, 5 μm. When the core is a carbon-based core, the average particle diameter (D5) of the negative electrode active material may range from 6 μm to 55 μm, preferably, 15 μm. In this case, when the average particle diameter of the negative electrode active material is greater than 55 μm, the size of the active material is too large, and thus charging and discharging are not properly performed or the degree of swelling increases, and it is difficult to manufacture an electrode.

In addition, the negative electrode active material of the present invention may have a specific surface area (BET) of 0.5 m²/g to 20 m²/g.

As described above, because the negative electrode active material of the present invention has a structure in which each of a plurality of high-density Si layers and each of a plurality of low-density Si layers are alternately and repeatedly formed on the surface of the core, the low-density Si layers absorb volume expansion occurring in the core and the high-density Si layers of the negative electrode active material during charging and discharging, resulting in the reduction in occurrence of cracks. In addition, even though cracks occur in the high-density Si layers, the low-density Si layers in which no cracks occur are disposed between the high-density Si layers, and thus continuous exposure of an interface of the core to an electrolyte is prevented, thereby achieving physical stability. As a result, improvement effects of lifespan characteristics may be obtained.

In addition, the negative electrode active material of the present invention may further include a carbon coating layer on a surface of the plurality of coating layers.

In this case, the carbon coating layer may be formed by a carbon coating process using chemical vapor deposition (CVD) or a carbon coating process via pitch calcination.

In another embodiment, the carbon coating layer may be formed by coating the surface of the core including the plurality of coating layers with at least one polymer selected from the group consisting of a vinyl-based resin, a phenol-based resin, a cellulose-based resin, a pitch-based resin, and a tar-based resin, and then heat-treating the resulting core.

The carbon coating layer may be included in an amount of 50 wt % or less, in particular, 1 wt % to 30 wt % with respect to the total weight of the negative electrode active material. When the amount of the carbon coating layer is within the above range, the negative electrode active material may have further enhanced electronic conductivity.

The negative electrode active material of the present invention may have a structure as illustrated in FIG. 1.

In particular, as illustrated in FIG. 1, the negative electrode active material of the present invention may include: a core 1 consisting of an active material at the center thereof; and a plurality of coating layers, in which first high-density and low-density Si layers 3 and 5, and second high-density and low-density Si layers 7 and 9 are sequentially disposed, on a surface of the core 1. In addition, a carbon coating layer 11 may be formed on a surface of the low-density Si layer positioned at an interface (the outermost portion) of the negative electrode active material.

Method of Preparing Negative Electrode Active Material

An embodiment of the present invention also provides a method of preparing a composite negative electrode active material, including: forming a high-density Si layer on a surface of a core capable of intercalating and deintercalating lithium ions; forming a low-density Si layer on the surface of the core with the high-density Si layer formed thereon; and repeating the forming of the high-density Si layer and the forming of the low-density Si layer a plurality of times.

In the method of manufacturing a composite negative electrode active material, all of the content in the foregoing description for the composite negative electrode active material may be applied herein.

First, a high-density Si layer is formed on a surface of a core capable of intercalating and deintercalating lithium ions according to the method of the present invention (process 1).

In particular, the high-density Si layer may be formed on the surface of the core by radio-frequency (RF) sputtering using an n-type or p-type Si target under conditions where an argon (Ar) working gas pressure has been adjusted to $1.0 \times 10^{-3}$ mbar to $2.0 \times 10^{-3}$ mbar.

Subsequently, a low-density Si layer is formed on the surface of the core with the high-density Si layer formed thereon (process 2).

The low-density Si layer may be formed by RF sputtering using an n-type or p-type Si target under conditions where an Ar working gas pressure has been adjusted to $1.0 \times 10^{-2}$ mbar to $2.0 \times 10^{-2}$ mbar.

In this case, when the Ar working gas pressure is high ($1.0 \times 10^{-2}$ mbar to $2.0 \times 10^{-2}$ mbar), a Si deposition rate is fast, but decreased density results from a difficulty in deposition. On the other hand, when the Ar working gas pressure is low ($1.0 \times 10^{-3}$ mbar to $2.0 \times 10^{-3}$ mbar), the deposition rate is slow, but deposition is completed, resulting in increased density.

Lastly, in the method of the present invention, the forming of the high-density Si layer and the forming of the low-density Si layer are repeated a plurality of times (process 3).

Preferably, the high-density Si layer and the low-density Si layer are formed as two or more layers.

Meanwhile, the method of the present invention may further include, after preparing the negative electrode active material including a plurality of coating layers comprising two or more Si layers having different densities on the surface of the core as described above, forming a carbon coating layer on the surface of the coating layers.

The forming of the carbon coating layer may be performed by carbon coating using CVD or carbon coating via pitch calcination.

In addition, the calcination process may be performed at a temperature ranging from 600□ to 1,100□.

As described above, the present invention provides the negative electrode active material including a core formed of an active material, a plurality of coating layers, in which a high-density Si layer and a low-density Si layer are alternately formed, on a surface of the core, and, optionally, a carbon coating layer, and thus cracks may be prevented from occurring in the negative electrode active material by controlling the volume expansion rate of the negative electrode active material during charging and discharging. That is, because the high-density Si layers capable of realizing high capacity have a high-volume expansion rate, cracks are likely to occur in the active material layer, and each crack consecutively occurs up to the interface of the active material layer. To prevent this, the low-density Si layer is formed between the high-density Si layers, and thus the occurrence of cracks in the active material layer may be prevented despite the occurrence of volumetric expansion. As such, when Si layers in which cracks are formed and Si layers in which no cracks are formed co-exist, the negative electrode active material is physically stable. As a result, a secondary battery including the negative electrode active material may have enhanced cycle lifespan characteristics and enhanced capacity characteristics.

Negative Electrode and Secondary Battery Including the Same

An embodiment of the present invention also provides a negative electrode including a current collector, and the composite negative electrode active material of the present invention formed on at least one surface of the current collector.

The negative electrode current collector is not particularly limited as long as it does not cause any chemical change in the fabricated battery and has high conductivity. For example, the negative electrode current collector may be made of copper, stainless steel, aluminum, nickel, titanium, or calcined carbon; copper or stainless steel surface-treated with carbon, nickel, titanium, or silver; an aluminum-cadmium alloy; or the like.

The current collector may typically have a thickness of 3 μm to 500 μm, and may have fine irregularities at a surface of the current collector to increase adhesion between the current collector and the negative electrode active material. For example, the current collector may be in any of various forms including a film, a sheet, foil, a net, a porous structure, a foam, non-woven fabric, and the like.

In addition, the negative electrode active material may optionally further include a conductive material, a binder, a filler, or the like.

The conductive material is not particularly limited so long as it does not cause chemical changes in the fabricated battery and has conductivity. Non-limiting examples of conductive materials include graphite such as natural or artificial graphite; carbonaceous materials such as carbon black, acetylene black, Ketjen black, channel black, furnace black, lamp black, and thermal black; conductive fibers such as carbon fibers and metallic fibers; metallic powders such as carbon fluoride powder, aluminum powder, and nickel powder; conductive whiskers such as zinc oxide and potassium titanate; conductive metal oxides such as titanium oxide; and polyphenylene derivatives.

The conductive material may generally be included in an amount of 1 wt % to 30 wt % based on the total weight of a mixture including a negative electrode active material.

The binder is not particularly limited as long as it assists in binding of an active material to a conductive material or the like and binding of an active material to a current collector. Non-limiting examples of the binder include polyvinylidenefluoride, polyacrylonitrile, polyvinyl alcohol, carboxymethylcellulose (CMC), starch, hydroxypropylcellulose, regenerated cellulose, polyvinylpyrrolidone, tetrafluoroethylene, polyethylene, polypropylene, ethylene-propylene-diene monomers (EPDMs), sulfonated EPDMs, styrene-butadiene rubber, fluorine rubber, and various copolymers.

The binder may generally be included in an amount of 1 wt % to 30 wt % based on the total weight of a mixture including a negative electrode active material.

The filler is a component that suppresses the expansion of an electrode and may be optionally used, and is not particularly limited as long as it is a fibrous material that does not cause any chemical change in the fabricated battery. For example, the filler may be an olefin-based polymer such as polyethylene, polypropylene, or the like; a fibrous material such as glass fiber, carbon fiber, or the like.

An embodiment of the present invention also provides a lithium secondary battery including a positive electrode, a negative electrode, a separator between the positive electrode and the negative electrode, and a non-aqueous electrolyte, in which the negative electrode includes the negative electrode of the present invention.

The positive electrode may be manufactured using a method commonly known in the art, for example, by applying (e.g, coating) a positive electrode active material slurry on a current collector made of a metal material and then pressing and drying the resulting current collector.

In this case, the positive electrode active material slurry may include a positive electrode active material, and may optionally further include a conductive material, a binder, a filler, or the like.

As a representative example, the positive electrode active material may include one selected from the group consisting of $LiCoO_2$, $LiNiO_2$, $LiMnO_2$, $LiMn_2O_4$, $Li(Ni_aCo_bMn_c)O_2$ where $0<a<1$, $0<b<1$, $0<c<1$, and $a+b+c=1$, $LiNi_{1-Y}Co_YO_2$, $LiCo_{1-Y}Mn_YO_2$, $LiNi_{1-Y}Mn_YO_2$ where $0 \leq Y<1$, $Li(Ni_a Co_bMn_c)O_4$ where $0<a<2$, $0<b<2$, $0<c<2$, and $a+b+c=2$, $LiMn_{2-z}Ni_zO_4$, and $LiMn_{2-z}Co_zO_4$ where $0<Z<2$, or a mixture of two or more of these materials.

The conductive material, the binder, and the like may be identical to or different from those used in the negative electrode active material.

In addition, the positive electrode active material slurry may include an organic solvent such as N-methylpyrrolidone (NMP), dimethyl formamide (DMF), acetone, dimethyl acetamide, or the like, water, or the like. The solvent is used in a sufficient amount to dissolve and disperse the electrode active material, the binder, and the conductive material in consideration of the thickness of the electrode active material slurry to be applied and manufacturing yield.

In addition, the positive electrode current collector may be any highly conductive metal that is capable of being easily adhered to the active material slurry and has no reactivity within a voltage range of a battery. Non-limiting examples of the positive electrode current collector include foil made of aluminum, nickel, or a combination thereof.

In addition, the negative electrode may further include a general negative electrode active material, in addition to the above-described negative electrode active material of the present invention. The general negative electrode active material may be any negative electrode active material capable of intercalating and deintercalating lithium ions that may be used for a negative electrode in the art.

In addition, the separator is disposed between the positive electrode and the negative electrode, and may be an insulating porous thin film having high ion permeability and high mechanical strength. In particular, as the separator, sheets or non-woven fabrics, made of an olefin-based polymer such as polypropylene; or glass fiber or polyethylene, which have chemical resistance and hydrophobicity is used. The separator may generally have a pore diameter of 0.01 μm to 10 μm, and may generally have a thickness of 5 μm to 300 μm.

The non-aqueous electrolyte may include an electrolyte and a lithium salt, and, as the electrolyte, a non-aqueous organic solvent, an organic solid electrolyte, or the like is used.

The non-aqueous organic solvent may be, for example, an aprotic organic solvent such as N-methyl-2-pyrrolidinone, propylene carbonate, ethyl methyl carbonate, ethylene carbonate, butylene carbonate, dimethyl carbonate, diethyl carbonate, γ-butyrolactone, 1,2-dimethoxy ethane, tetrahydrofuran, 2-methyltetrahydrofuran, dimethyl sulfoxide, 1,3-dioxolane, formamide, dimethylformamide, dioxolane, acetonitrile, nitromethane, methyl formate, methyl acetate, phosphoric acid triester, trimethoxy methane, dioxolane derivatives, sulfolane, methyl sulfolane, 1,3-dimethyl-2-imidazolidinone, propylene carbonate derivatives, tetrahydrofuran derivatives, ether, methyl propionate, ethyl propionate, or the like.

Non-limiting examples of the organic solid electrolyte include polyethylene derivatives, polyethylene oxide derivatives, polypropylene oxide derivatives, phosphoric acid ester polymers, poly agitation lysine, polyester sulfide, polyvinyl alcohol, polyvinylidene fluoride, and polymers containing ionic dissociation groups.

The lithium salt is a material that is readily soluble in the non-aqueous electrolyte. Non-limiting examples of the lithium salt include LiCl, LiBr, LiI, $LiClO_4$, $LiBF_4$, $LiB_{10}C_{10}$, $LiPF_6$, $LiCF_3SO_3$, $LiCF_3CO_2$, $LiAsF_6$, $LiSbF_6$, $LiAlCl_4$, $CH_3SO_3Li$, $CF_3SO_3Li$, $(CF_3SO_2)_2NLi$, chloroborane lithium, lower aliphatic carboxylic acid lithium, lithium tetraphenyl borate, and imide.

In addition, in order to improve charge/discharge characteristics and flame retardancy, for example, pyridine, triethylphosphite, triethanolamine, cyclic ether, ethylenediamine, n-glyme, hexaphosphoric triamide, nitrobenzene derivatives, sulfur, quinone imine dyes, N-substituted oxazolidinone, N,N-substituted imidazolidine, ethylene glycol dialkyl ether, ammonium salts, pyrrole, 2-methoxy ethanol, aluminum trichloride, or the like may be added to the non-aqueous electrolyte. In some cases, in order to impart incombustibility, the electrolyte may further include a halogen-containing solvent such as carbon tetrachloride and ethylene trifluoride. In addition, in order to improve high-temperature storage characteristics, the electrolyte may further include carbon dioxide gas.

MODE OF THE INVENTION

Hereinafter, the present invention will be described in further detail with reference to the following examples. However, these examples according to the present invention may be modified in many different forms, and should not be construed as limiting the scope of the present invention. The examples of the present invention are provided to more completely explain the present invention to those of ordinary skill in the art.

EXAMPLES

Example 1

(Preparation of Si-Non-Carbon-Based Negative Electrode Active Material)

10 g of a non-carbon-based core having an average particle diameter of 5 μm (SiO silicon oxide powder) was prepared as a core. Subsequently, n-type silicon having a purity of 99% or more as a Si precursor was set as a target in an RF sputtering gun, an Ar working gas pressure was set to be $1.5 \times 10^{-3}$ mbar, and then the core was subjected to sputtering for 30 minutes, thereby forming a first high-density Si layer (bulk density: 2.33 g/cm$^3$, thickness: 110 nm) on a surface of the core.

Next, n-type silicon having a purity of 99% or more as a Si precursor was set as a target in the RF sputtering gun, the Ar working gas pressure was set to be $2.5 \times 10^{-2}$ mbar, and then the core with the first high-density Si layer formed thereon was subjected to sputtering for 10 minutes, thereby forming a first low-density Si layer (bulk density: 2.0 g/cm$^3$, thickness: 120 nm) thereon.

Subsequently, n-type silicon having a purity of 99% or more as a Si precursor was set as a target in the RF sputtering gun, the Ar working gas pressure was set to be $1.5 \times 10^{-3}$ mbar, and then the resulting core was subjected to sputtering for 30 minutes, thereby forming a second high-density Si layer (bulk density: 2.33 g/cm$^3$, thickness: 110 nm) on the surface of the resulting core.

Next, n-type silicon having a purity of 99% or more as a Si precursor was set as a target in the RF sputtering gun, the Ar working gas pressure was set to be $2.5 \times 10^{-2}$ mbar, and then the resulting core was subjected to sputtering for 10 minutes to form a second low-density Si layer (bulk density: 2.0 g/cm$^3$, thickness: 110 nm) thereon, thereby completing the preparation of a Si-non-carbon-based negative electrode active material.

The negative electrode active material had an average particle diameter (D50) of 50 μm and a specific surface area (BET) of 6.0 m$^2$/g.

(Manufacture of Coin-Type Half-Cell)

The negative electrode active material prepared according to the above-described processes, particulate graphite as a conductive material, and polyacrylonitrile as a binder were mixed in a weight ratio of 7:2:1 to prepare 0.2 g of a mixture. 3.1 g of N-methyl-2-pyrrolidone (NMP) as a solvent was added to the mixture to prepare a negative electrode mixture slurry.

Subsequently, the negative electrode mixture slurry was applied on Cu foil having a thickness of 20 μm as a negative electrode current collector and dried. In this case, the temperature of circulating air was 80□. Subsequently, the resulting current collector was roll-pressed and dried in a vacuum oven at 130□ for 12 hours, thereby completing the manufacture of a negative electrode.

The negative electrode manufactured as above was cut into a circular form with an area of 1.4875 cm$^2$ and used as a negative electrode, and Li metal foil cut into a circular form with an area of 1.7671 cm$^2$ was used as a positive electrode. A porous polyethylene separator was positioned between the positive electrode and the negative electrode, and an electrolyte prepared by dissolving 0.5 wt % of vinylene carbonate and 1M LiPF$_6$ in a mixed solution of ethyl methyl carbonate (EMC) and ethylene carbonate (EC) in a volume ratio of 7:3 was injected into the resulting structure, thereby completing the manufacture of a lithium coin-type half-cell.

Example 2

The negative electrode active material prepared according to Example 1 and pitch as a carbon precursor were mixed in an amount of 5 parts by weight of pitch with respect to 100 parts by weight of the negative electrode active material, and calcined to prepare a Si-non-carbon-based negative electrode active material including a carbon coating layer. In this case, the content of the carbon coating layer was 4.76 wt % with respect to the total weight of the negative electrode active material.

A coin-type half-cell was manufactured in the same manner as in Example 1, except that the negative electrode active material prepared according to the above-described processes was used.

Example 3

(Preparation of Si—C-Based Negative Electrode Active Material)

A Si—C-based negative electrode active material having an average particle diameter (D50) of 17 μm and a specific surface area (BET) of 15.0 m$^2$/g was prepared in the same manner as in Example 1, except that 10 g of a carbon-based core (natural graphite) having an average particle diameter of 15 μm was used as the core.

(Manufacture of Coin-Type Half-Cell)

The Si—C-based negative electrode active material particles, carbon black as a conductive material, and carboxylmethyl cellulose (CMC) and styrene butadiene rubber (SBR) as binders were mixed in a weight ratio of 95.8:1:1.7:1.5 to prepare a negative electrode mixture. The negative electrode mixture was applied on a Cu current collector, and then the resulting current collector was dried in a vacuum oven at 130□ and pressed, thereby completing the manufacture of a negative electrode.

In addition, Li metal was used as a counter electrode, a porous polyethylene separator was positioned between the negative electrode and the Li metal, and an electrolyte prepared by dissolving 0.5 wt % of vinylene carbonate and 1M LiPF$_6$ in a mixed solution of EMC and EC in a volume ratio of 7:3 was injected into the resulting structure, thereby completing the manufacture of a lithium coin-type half-cell.

Example 4

The negative electrode active material prepared according to Example 3 and pitch as a carbon precursor were mixed in an amount of 10 parts by weight of pitch with respect to 100 parts by weight of the negative electrode active material, and calcined to prepare a Si—C-based negative electrode active material including a carbon coating layer. In this case, the content of the carbon coating layer was 9.09 wt % with respect to the total weight of the negative electrode active material.

A coin-type half-cell was manufactured in the same manner as in Example 3, except that the negative electrode active material particles prepared as above were used.

Comparative Example 1

(Negative Electrode Active Material Including Single-Layered Si Coating Layer)

10 g of a non-carbon-based core having an average particle diameter of 5 μm (SiO silicon oxide powder) was prepared as a core. Subsequently, n-type silicon having a purity of 99% or more as a Si precursor was set as a target in an RF sputtering gun, an Ar working gas pressure was set to be $1.5 \times 10^{-3}$ mbar, and then the core was subjected to sputtering for 120 minutes, thereby completing the preparation of a Si-non-carbon-based negative electrode active material including a single-layered Si layer (bulk density: 2.33 g/cm$^3$, thickness: 470 nm) on a surface of the core.

A coin-type half-cell (CR2032 type) was manufactured in the same manner as in Example 1, except that the negative electrode active material prepared according to the above-described processes was used.

Comparative Example 2

A Si—C-based negative electrode active material including a single-layered Si layer (bulk density: 2.33 g/cm$^3$, thickness: 470 nm) formed on a surface of a core was prepared in the same manner as in Comparative Example 1, except that 10 g of a carbon-based core (natural graphite) having an average particle diameter of 15 μm was used as the core.

A coin-type half-cell was manufactured in the same manner as in Example 3, except that the negative electrode active material prepared according to the above-described processes was used.

Experimental Example 1: Capacity Characteristics

Charge/discharge characteristics of each of the secondary batteries manufactured according to Examples 1 to 4 and Comparative Examples 1 and 2 were evaluated, and the results thereof are shown in Table 1 below.

Each of the secondary batteries of Examples 1 to 4 and Comparative EXAMPLES 1 and 2 was charged at 0.1 C until the voltage reached 5 mV, and then the charging was cut off when the constant current reached 0.005 C, and discharged until the constant voltage reached 1.5 V.

In particular, charging and discharging were performed at 0.1 C during the first two cycles of charging, and then performed at 0.5 C from the 3$^{rd}$ to 49$^{th}$ cycle of charging and discharging. The charging and discharging were cut off at a state of the 50$^{th}$ cycle of charging (a state in which lithium is included in the negative electrode), and each battery was disassembled and the thickness of the negative electrode was measured, and then an electrode thickness variation was calculated.

TABLE 1

| | Discharge capacity (mAh/g) | Initial efficiency (%) | Capacity retention (discharge capacity at 49$^{th}$ cycle/ discharge capacity at 1$^{st}$ cycle × 100) | Electrode thickness variation (thickness change/initial thickness (charging at 50$^{th}$ cycle) |
|---|---|---|---|---|
| Example 1 | 1,743 | 78.2 | 15.4 | 204 |
| Example 2 | 2,010 | 80.3 | 30.6 | 190 |
| Comparative Example 1 | 1,700 | 77.5 | 0.5 | 350 |
| Example 3 | 550 | 84 | 70.3 | 279 |
| Example 4 | 601 | 86.5 | 75.6 | 265 |
| Comparative Example 3 | 547 | 83.8 | 53.2 | Peeling of active material layer |

As shown in Table 1, it was confirmed that the secondary battery including each of the Si-non-carbon-based negative electrode active materials of Examples 1 and 2 including a plurality of Si layers having different densities exhibited higher capacity retention and a lower electrode thickness variation than those of the secondary battery including the negative electrode active material of Comparative Example 1 including a single-layered Si layer.

The negative electrode active materials of Examples 1 and 2 include a plurality of Si layers having different densities formed on the surface of the non-carbon-based core, and thus exhibit a lower electrode thickness variation than that of the case of Comparative Example 1 because the low-density Si layer absorbs volumetric expansion occurring in the negative electrode active material and the high-density Si layer during charging and discharging repeatedly.

In addition, exposure of the interface of the core to the electrolyte may be prevented due to the low-density Si layer in which no cracks occur even though cracks are formed in the high-density Si layer. Accordingly, it was confirmed that the cases of Examples 1 and 2 exhibited higher capacity retention after the 50$^{th}$ cycle than that of the case of Comparative Example 1.

Meanwhile, as shown in Table 1, it was confirmed that the secondary battery including each of the Si—C-based negative electrode active materials including a plurality of Si layers having different densities, prepared according to Examples 3 and 4, exhibited higher capacity retention and a superior electrode thickness variation than those of the secondary battery including the negative electrode active material including a singly-layered Si layer of Comparative Example 2.

The superior electrode thickness variations of the cases of Examples 3 and 4 than that of the case of Comparative Example 2 are attributed to the fact that the plurality of Si layers having different densities formed on the surface of the carbon-based core, in particular, the low-density Si layer, absorb volumetric expansion. In the case of Comparative Example 2, swelling excessively occurs during charging and discharging, and thus the active material layer was peeled off from the current collector and, accordingly, the electrode thickness variation could not be confirmed.

In addition, in the cases of Examples 3 and 4, exposure of the interface of the core to the electrolyte may be prevented due to the low-density Si layer in which no cracks occur even though cracks are formed in the high-density Si layer. Accordingly, it was confirmed that the cases of Examples 3 and 4 exhibited higher capacity retention after the 50$^{th}$ cycle than that of the case of Comparative Example 2.

The invention claimed is:

1. A composite negative electrode active material comprising:
   a core capable of intercalating and deintercalating lithium ions; and
   a plurality of coating layers comprising two or more silicon (Si) layers having different densities formed on a surface of the core,
   wherein each of the two or more Si layers include at least about 90 wt % of Si,
   wherein the core comprises a non-carbon-based core.

2. The composite negative electrode active material of claim 1, wherein the non-carbon-based core comprises Si or a non-crystalline or crystalline Si oxide represented by $SiO_x$ where $0<x\leq2$.

3. The composite negative electrode active material of claim 1, wherein a ratio of an average particle diameter of the core to a total thickness of the plurality of coating layers is 1:0.1 to 0.7.

4. The composite negative electrode active material of claim 1, wherein the plurality of coating layers comprises a high-density Si layer and a low-density Si layer.

5. The composite negative electrode active material of claim 4, wherein each of the high-density Si layer and the low-density Si layer comprises one selected from the group consisting of a Si single phase, $SiO_x$ where $0<x\leq2$, and an Si—Z alloy wherein Z is an alkali metal, an alkaline earth metal, a Group 13 element, a Group 14 element, a transition metal, a rare earth element, or a combination thereof, except for Si, or a mixture of two or more of these materials.

6. The composite negative electrode active material of claim 4, wherein the plurality of coating layers has a structure in which two or more of the high-density Si layer and the low-density Si layer are sequentially and repeatedly formed.

7. The composite negative electrode active material of claim 6, wherein a thickness ratio of the high-density Si layer to the low-density Si layer is 1:1.

8. The composite negative electrode active material of claim 4, wherein the high-density Si layer has a bulk density of greater than 2.0 g/cm³ to 2.33 g/cm³ or less.

9. The composite negative electrode active material of claim 4, wherein the low-density Si layer has a bulk density of 2.0 g/cm³ or less.

10. The composite negative electrode active material of claim 1, wherein the negative electrode active material has an average particle diameter (D50) of 3 μm to 55 μm.

11. The composite negative electrode active material of claim 1, wherein the negative electrode active material has a specific surface area (BET) of 0.5 m²/g to 20 m²/g.

12. The composite negative electrode active material of claim 1, wherein the composite negative electrode active material further comprises a carbon coating layer.

13. A method of preparing the composite negative electrode active material of claim 1, the method comprising:
    forming a high-density Si layer on a surface of a core capable of intercalating and deintercalating lithium ions;
    forming a low-density Si layer on the surface of the core with the high-density Si layer formed thereon; and
    repeating the forming of the high-density Si layer and the forming of the low-density Si layer a plurality of times.

14. The method of claim 13, wherein the forming of the high-density Si layer is performed by radio-frequency (RF) sputtering under conditions where an argon (Ar) working gas pressure has been adjusted to $1.0\times10^{-3}$ mbar to $2.0\times10^{-3}$ mbar.

15. The method of claim 13, wherein the forming of the low-density Si layer is performed by RF sputtering under conditions where an Ar working gas pressure has been adjusted to $1.0\times10^{-2}$ mbar to $2.0\times10^{-2}$ mbar.

16. The method of claim 13, wherein the method further comprises forming a carbon coating layer.

17. A negative electrode comprising:
    a current collector; and
    an electrode mixture layer comprising the composite negative electrode active material of claim 1 formed on at least one surface of the current collector.

18. A lithium secondary battery comprising a positive electrode, a negative electrode, a separator between the positive electrode and the negative electrode, and a non-aqueous electrolyte,
    wherein the negative electrode comprises the negative electrode of claim 17.

* * * * *